United States Patent
Li et al.

(10) Patent No.: US 12,040,234 B2
(45) Date of Patent: Jul. 16, 2024

(54) SEMICONDUCTOR DEVICE AND METHOD FOR FABRICATING THE SAME

(71) Applicant: UNITED MICROELECTRONICS CORP., Hsin-Chu (TW)

(72) Inventors: Yi-Fan Li, Tainan (TW); Po-Ching Su, Tainan (TW); Yu-Fu Wang, Taoyuan (TW); Min-Hua Tsai, Tainan (TW); Ti-Bin Chen, Tainan (TW); Chih-Chiang Wu, Tainan (TW); Tzu-Chin Wu, Chiayi County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 217 days.

(21) Appl. No.: 17/393,387

(22) Filed: Aug. 3, 2021

(65) Prior Publication Data

US 2023/0005795 A1    Jan. 5, 2023

(30) Foreign Application Priority Data

Jul. 2, 2021 (CN) .......................... 202110749340.4

(51) Int. Cl.
*H01L 29/49* (2006.01)
*H01L 21/8234* (2006.01)
*H01L 29/423* (2006.01)
*H01L 29/78* (2006.01)

(52) U.S. Cl.
CPC ........... *H01L 21/823437* (2013.01); *H01L 21/823462* (2013.01); *H01L 21/823481* (2013.01); *H01L 29/4232* (2013.01); *H01L 29/78* (2013.01)

(58) Field of Classification Search
None
See application file for complete search history.

(56) References Cited

U.S. PATENT DOCUMENTS

| | | | |
|---|---|---|---|
| 9,349,833 B1 * | 5/2016 | Hung | H01L 27/088 |
| 2007/0152252 A1 | 7/2007 | Buehler et al. | |
| 2016/0043186 A1 * | 2/2016 | Liu | H01L 29/7848 |
| | | | 257/401 |
| 2019/0058050 A1 * | 2/2019 | Hsu | H01L 29/4958 |

* cited by examiner

*Primary Examiner* — Joseph C. Nicely
*Assistant Examiner* — Lamont B Koo
(74) *Attorney, Agent, or Firm* — Winston Hsu

(57) ABSTRACT

A method for fabricating a semiconductor device includes the steps of forming a metal gate on a substrate, a spacer around the metal gate, and a first interlayer dielectric (ILD) layer around the spacer, performing a plasma treatment process to transform the spacer into a first bottom portion and a first top portion, performing a cleaning process to remove the first top portion, and forming a second ILD layer on the metal gate and the first ILD layer.

8 Claims, 4 Drawing Sheets

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly to a method for fabricating metal gate transistor.

2. Description of the Prior Art

In current semiconductor industry, polysilicon has been widely used as a gap-filling material for fabricating gate electrode of metal-oxide-semiconductor (MOS) transistors. However, the conventional polysilicon gate also faced problems such as inferior performance due to boron penetration and unavoidable depletion effect which increases equivalent thickness of gate dielectric layer, reduces gate capacitance, and worsens driving force of the devices. In replacing polysilicon gates, work function metals have been developed to serve as a control electrode working in conjunction with high-K gate dielectric layers.

However, part of the spacer, part of the contact etch stop layer (CESL), and even part of the interlayer dielectric (ILD) layer may be removed when gate material layer made of polysilicon is removed during current fabrication of metal gate transistor so that conductive materials such as work function metal layer and low resistance metal layer deposited afterwards may form short circuit with adjacent contact plugs thereby affecting the performance of the device. Hence, how to resolve this issue has become an important task in this field.

SUMMARY OF THE INVENTION

According to an embodiment of the present invention, a method for fabricating a semiconductor device includes the steps of forming a metal gate on a substrate, a spacer around the metal gate, and a first interlayer dielectric (ILD) layer around the spacer, performing a plasma treatment process to transform the spacer into a first bottom portion and a first top portion, performing a cleaning process to remove the first top portion, and forming a second ILD layer on the metal gate and the first ILD layer.

According to another aspect of the present invention, a semiconductor device includes a metal gate on a substrate, a spacer adjacent to the metal gate, a source/drain region adjacent to the spacer, and a contact etch stop layer (CESL) around the spacer. Preferably, the spacer and the CESL include different heights.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
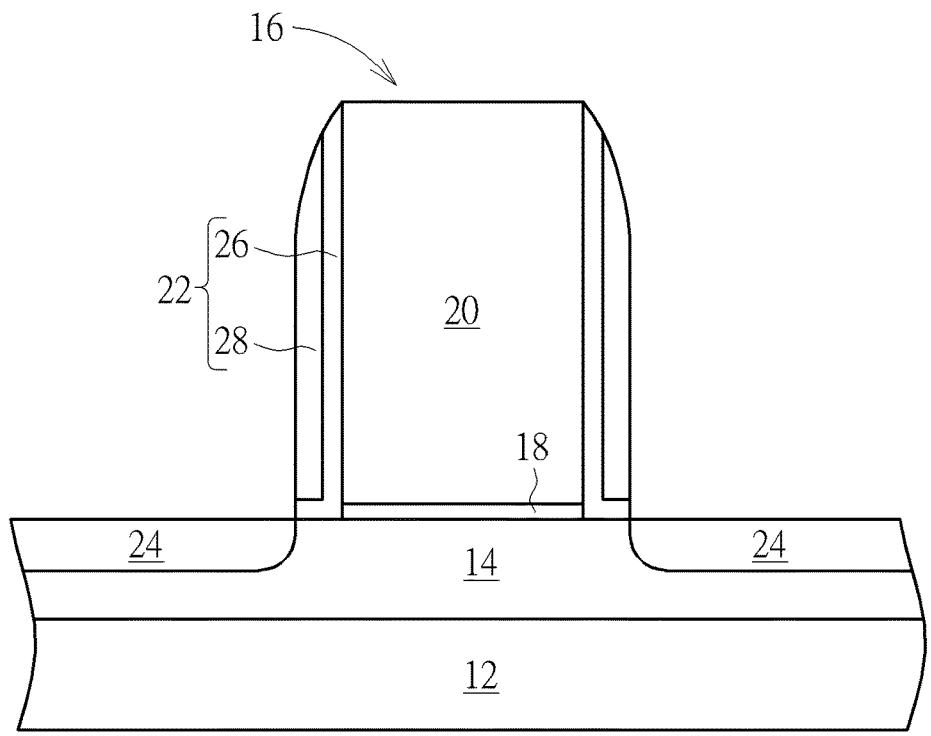
FIGS. 1-7 illustrate a method for fabricating semiconductor device according to an embodiment of the present invention.

Referring to FIGS. 1-7, FIGS. 1-7 illustrate a method for fabricating semiconductor device according to an embodiment of the present invention. As shown in FIG. 1, a substrate 12 is first provided, in which the substrate could be a silicon substrate or silicon-on-insulator (SOI) substrate. A transistor region, such as a PMOS region or a NMOS region could be defined on the substrate 12. At least a fin-shaped structure 14 and an insulating layer (not shown) are formed on the substrate 12, in which the bottom portion of the fin-shaped structure 14 is surrounded by the insulating later or shallow trench isolation (STI) preferably made of material such as silicon oxide. It should be noted that even though this embodiment pertains to the fabrication of a non-planar FET device such as FinFET device, it would also be desirable to apply the content of the following process to a planar FET device, which is also within the scope of the present invention.

According to an embodiment of the present invention, the fin-shaped structure 14 could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. Next, sacrificial layers can be removed completely by performing an etching process. Through the etching process, pattern defined by the spacers can be transferred into the substrate underneath, and through additional fin cut processes, desirable pattern structures, such as stripe patterned fin-shaped structures could be obtained.

Alternatively, the fin-shaped structure 14 could also be obtained by first forming a patterned mask (not shown) on the substrate, 12, and through an etching process, the pattern of the patterned mask is transferred to the substrate 12 to form the fin-shaped structure. Moreover, the formation of the fin-shaped structure could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structure. These approaches for forming fin-shaped structure are all within the scope of the present invention.

Next, at least a gate structures 16 or dummy gate is formed on the substrate 12. In this embodiment, the formation of the gate structure 16 could be accomplished by a gate first process, a high-k first approach from gate last process, or a high-k last approach from gate last process. Since this embodiment pertains to a high-k last approach, a gate dielectric layer or interfacial layer, a gate material layer, and a selective hard mask could be formed sequentially on the substrate 12, and a pattern transfer process is then conducted by using a patterned resist (not shown) as mask to remove part of the gate material layer and part of the gate dielectric layer through single or multiple etching processes. After stripping the patterned resist, a gate structure 16 composed of patterned gate dielectric layer 18 and patterned material layer 20 are formed on the substrate 12.

Next, at least a spacer 22 is formed on the sidewalls of the gate structure 16, a source/drain region 24 and/or epitaxial layer (not shown) is formed in the substrate 12 adjacent to two sides of the spacer 22, and a selective silicide layer (not shown) could be formed on the surface of the source/drain region 24. In this embodiment, the spacer 22 could be a single spacer or a composite spacer, such as a spacer including but not limited to for example an offset spacer 26 and a main spacer 28. Preferably, the offset spacer 26 and the main spacer 28 could include same material or different material. It should be noted that even though the offset spacer 26 in this embodiment preferably includes silicon carbon nitride (SiCN) according to other embodiments of the present invention both the offset spacer 26 and the main spacer 28 could also be made of material including but not limited to for example $SiO_2$, SiN, SiON, SiCN, or combination thereof. The source/drain region 24 could include n-type dopants or p-type dopants depending on the type of device being fabricated.

Figure 2:
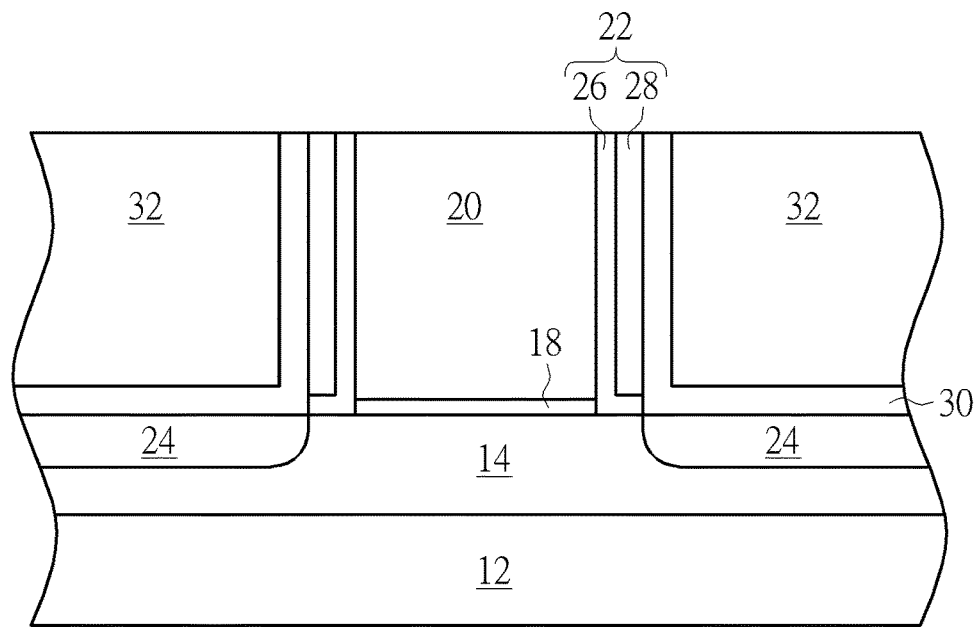

Next, as shown in FIG. 2, a contact etch stop layer (CESL) 30 is formed on the substrate 12 surface and the gate structure 16, and an interlayer dielectric (ILD) layer 32 is formed on the CESL 30 afterwards. Next, a planarizing process such as a chemical mechanical polishing (CMP) process is conducted to remove part of the ILD layer 32 and part of the CESL 30 to expose the gate material layer 20 composed of polysilicon so that the top surfaces of the gate material layer 20 and ILD layer 32 are coplanar.

Figure 3:
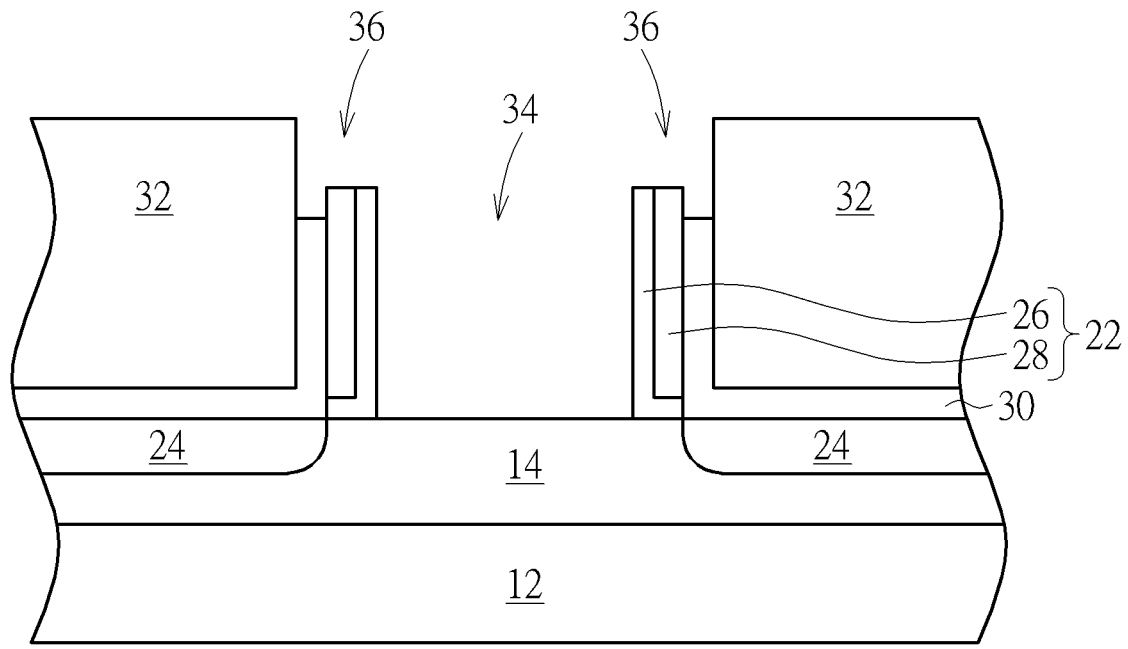

Next, as shown in FIG. 3, a replacement metal gate (RMG) process is conducted to transform the gate structure 16 into a metal gate. For instance, the RMG process could be accomplished by first performing a selective dry etching or wet etching process using etchants including but not limited to for example ammonium hydroxide ($NH_4OH$) or tetramethylammonium hydroxide (TMAH) to remove the gate material layer 20 or even gate dielectric layer 18 from gate structure 16 for forming recesses 34 and 36 in the ILD layer 32.

It should be noted that etching process conducted at this stage preferably removes all of the gate material layer 20 and at the same time removing part of the spacer 22, part of the CESL 30, and even part of the ILD layer 32 (not shown) to form the recesses 34, 36, in which the larger recess 34 exposes the surface of the substrate 12 while the recesses 36 on adjacent two sides expose the remaining spacer 22 and the CESL 30. Moreover, the etching process conducted at this stage also removes less spacer 22 and more CESL 30 as a result of different selectivity between the two elements 22, 30 so that the depth of the recess 36 directly on top of the CESL 30 is slightly deeper than the depth of the recess 36 directly on top of the spacer 22. Viewing from another perspective, the top surface of the remaining CESL 30 is slightly lower than the top surface of the remaining spacer 22.

Figure 4:
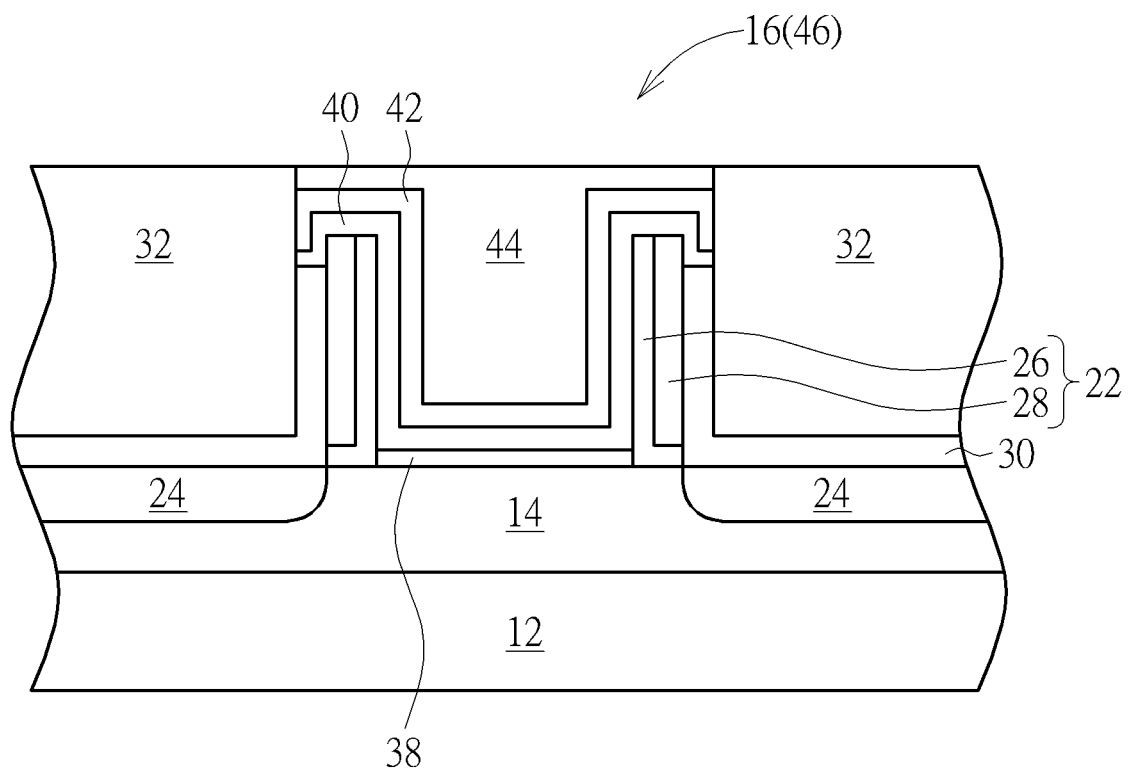

Next, as shown in FIG. 4, selective interfacial layer 38 or gate dielectric layer (not shown), a high-k dielectric layer 40, a work function metal layer 42, and a low resistance metal layer 44 are formed in the recesses 34, 36, and a planarizing process such as CMP is conducted to remove part of low resistance metal layer 44 to form a metal gate 46. It should be noted that each of the high-k dielectric layer 40, work function metal layer 42, and low resistance metal layer 44 are deposited into the recesses 34 and 36 at the same time to fill the recesses 34, 36 completely. In other words, each of the recesses 34, 36 are filled with the same material.

In this embodiment, the high-k dielectric layer 40 is preferably selected from dielectric materials having dielectric constant (k value) larger than 4. For instance, the high-k dielectric layer 40 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the work function metal layer 42 is formed for tuning the work function of the later formed metal gates to be appropriate in an NMOS or a PMOS. For an NMOS transistor, the work function metal layer 42 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 42 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 42 and the low resistance metal layer 44, in which the material of the barrier layer may include titanium (Ti), titanium nitride (TiN), tantalum (Ta) or tantalum nitride (TaN). Furthermore, the material of the low-resistance metal layer 44 may include copper (Cu), aluminum (Al), titanium aluminum (TiAl), cobalt tungsten phosphide (CoWP) or any combination thereof. Since the process of using RMG process to transform dummy gate into metal gate is well known to those skilled in the art, the details of which are not explained herein for the sake of brevity.

Figure 5:
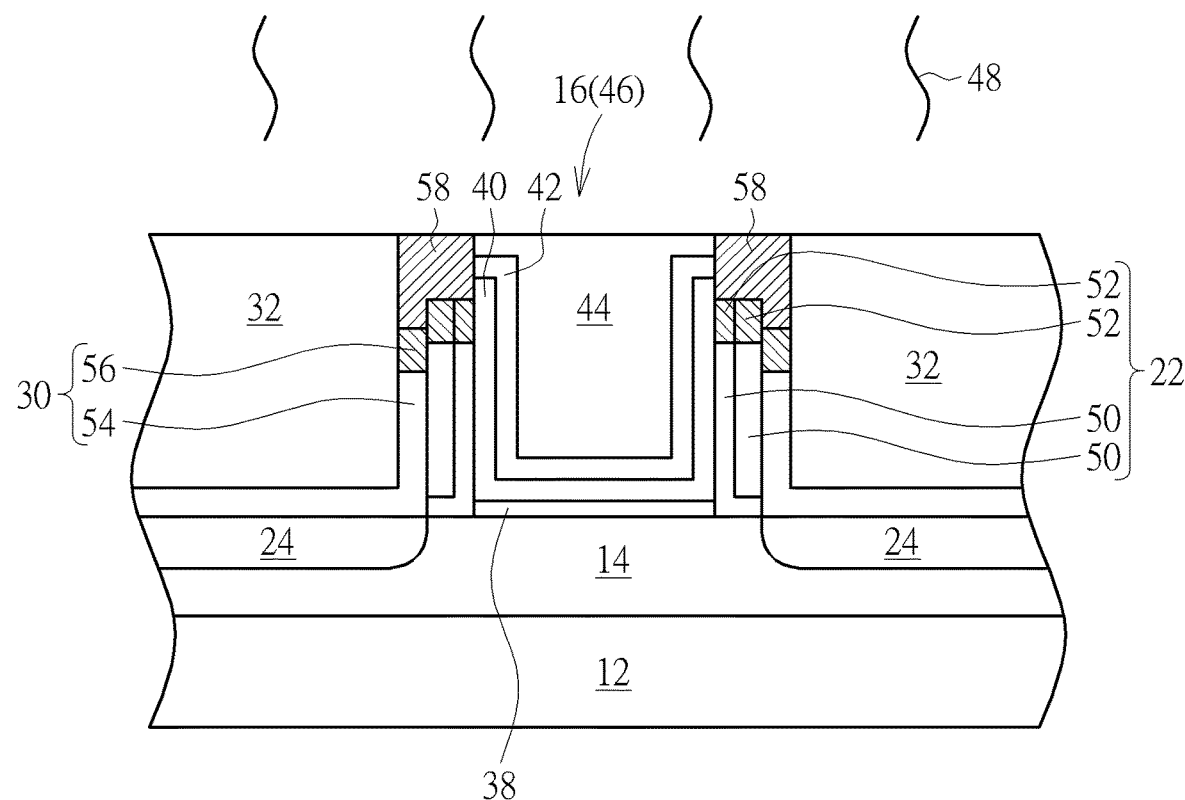

Next, as shown in FIG. 5, a plasma treatment process 48 is conducted to transform the spacer 22 into a first bottom portion 50 and a first top portion 52 and at the same time transforming the CESL 30 into a second bottom portion 54 and a second top portion 56 around or adjacent to two sides of the metal gate 46. Specifically, the plasma treatment process 48 is s accomplished by injecting a reacting gas such as nitrous oxide ($N_2O$) to react with the conductive material directly on top of the spacer 22 and CESL 30 as well as the top portions of the spacer 22 and the CESL 30. This transforms the conductive materials including the low resistance metal layer 44 made of Al and the work function metal layer 42 directly above the spacer 22 and CESL 30 into a dielectric portion 58 made of aluminum oxide ($Al_2O_3$) and at the same time transforms the spacer 22 into two portions including the first bottom portion 50 and a first top portion 52 and transforms the CESL 30 into two portions including the second bottom portion 54 and the second top portion 56.

In this embodiment, the first top portion 52 is preferably transformed into silicon carbon oxynitride (SiCON) through plasma treatment process 48, the first bottom portion 50 is still made of SiCN, the second top portion 56 is transformed into silicon oxynitride (SiON) through the plasma treatment process 48, and the second bottom portion 54 is still made of silicon nitride. Since the top portions of the spacer 22 and CESL 30 have been reacted with oxygen gas during the aforementioned plasma treatment process 48, the oxygen concentration of the bottom portions of the spacer 22 and the CESL 30 is preferably lower than the oxygen concentration of the top portions of the spacer 22 and the CESL 30. For instance, the oxygen concentration in the first bottom portion 50 is lower than the oxygen concentration in the first top portion 52 and the oxygen concentration in the second bottom portion 54 is lower than the oxygen concentration in the second top portion 56. Structurally, the top surface of the second bottom portion 54 is slightly lower than the top surface of the first bottom portion 50, the top surface of the second top portion 56 is slightly lower than the top surface of the first top portion 52, and the bottom surface of the dielectric portion 58 directly on top of the second top portion 56 is lower than the bottom surface of the dielectric portion 58 directly on top of the first top portion 52.

Figure 6:
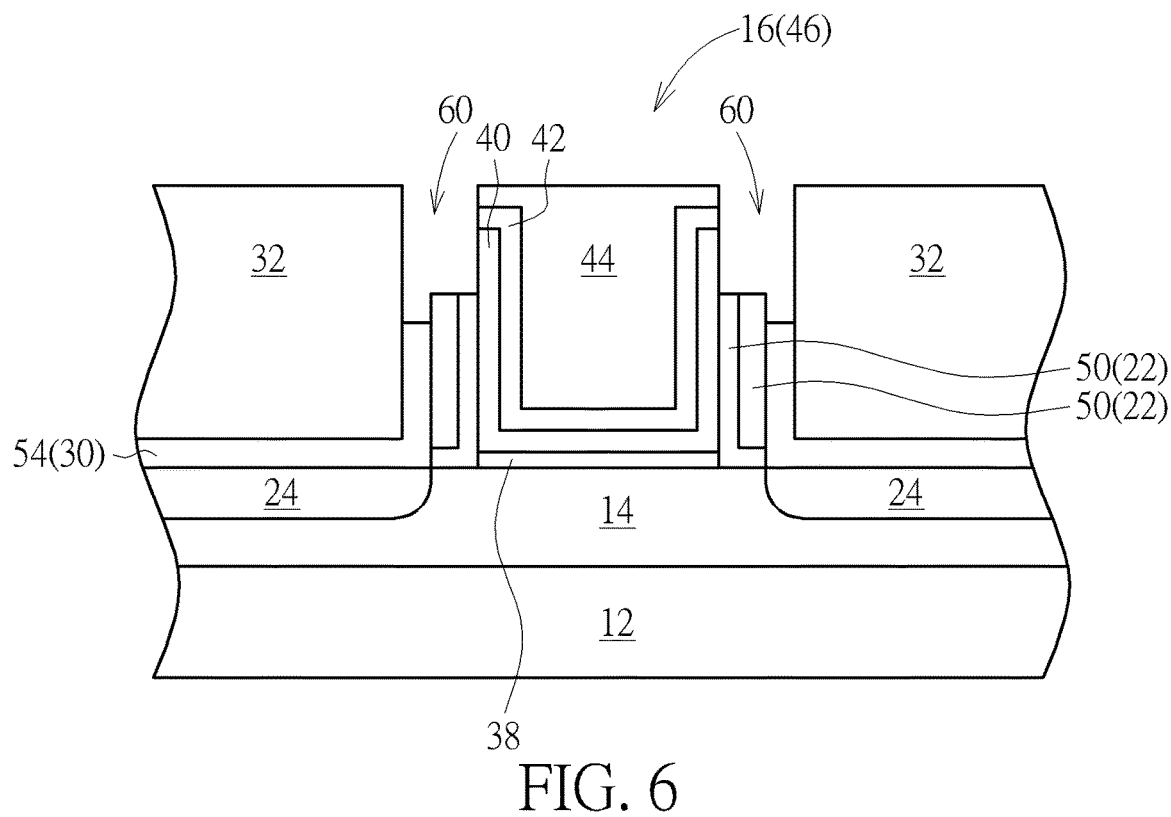

Next, as shown in FIG. 6, a cleaning process is conducted to remove the dielectric portion 58, the first top portion 52, and the second top portion 56 to form recesses 60. Specifically, the cleaning process conducted at this stage could be accomplished by using diluted hydrofluoric acid (dHF) with concentration between 10:1 to 100:1 to remove all of the dielectric portions 58, all of first top portions 52, and all of second top portions 56 to form recesses 60 exposing the first bottom portion 50 and the second bottom portion 54 underneath.

Figure 7:
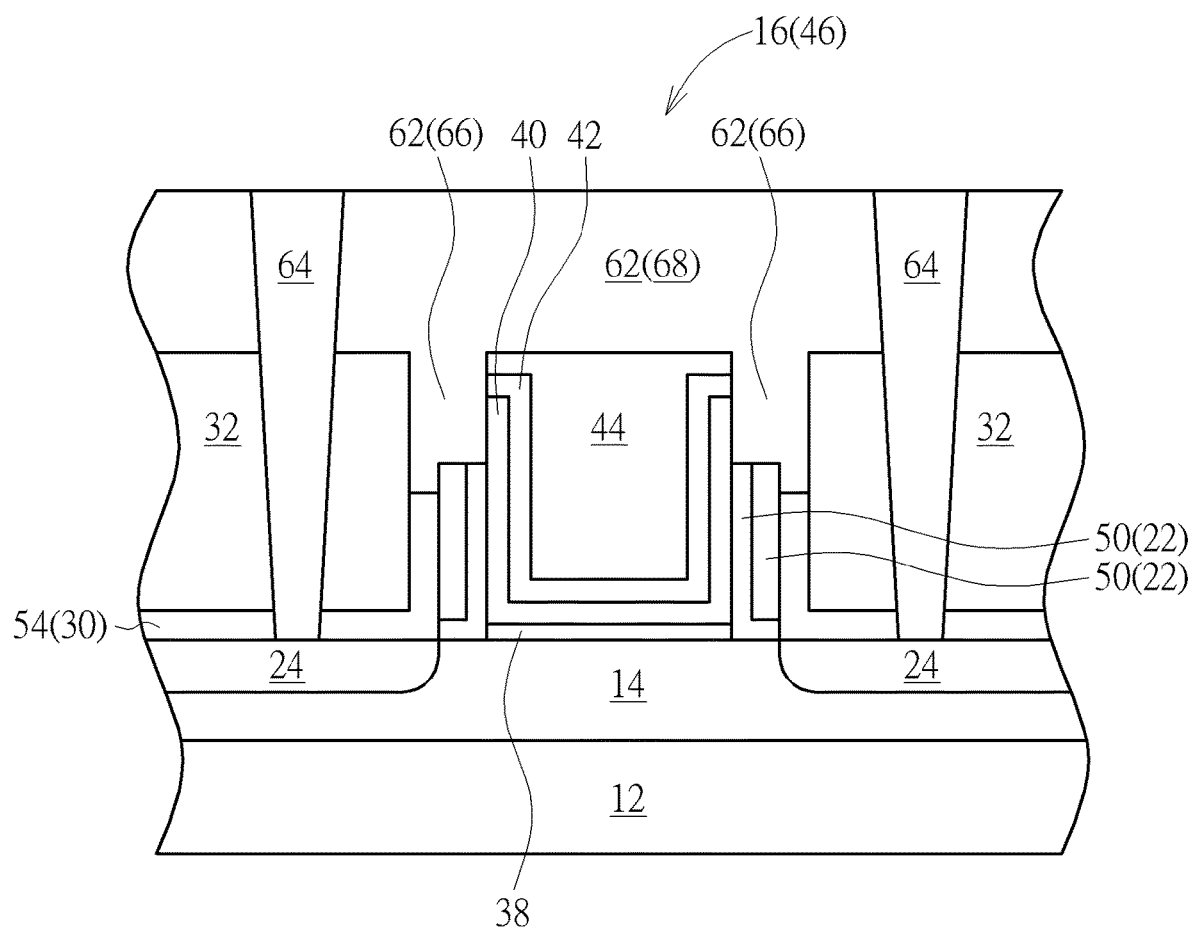

Next, as shown in FIG. 7, another ILD layer 62 is formed on the metal gate 46 and the ILD layer 32 to fill the recesses 60. Next, a photo-etching process is conducted by using a patterned mask (not shown) as mask to remove part of the ILD layers 32, 62 and part of the CESL 30 adjacent to the metal gate 42 for forming contact holes (not shown) exposing the source/drain region 24 underneath. Next, conductive materials including a barrier layer selected from the group consisting of titanium (Ti), titanium nitride (TiN), tantalum (Ta), and tantalum nitride (TaN) and a metal layer selected from the group consisting of tungsten (W), copper (Cu), aluminum (Al), titanium aluminide (TiAl), and cobalt tungsten phosphide (CoWP) are deposited into the contact holes, and a planarizing process such as CMP is conducted to remove part of aforementioned barrier layer and low resistance metal layer for forming contact plugs 64 electrically connecting the source/drain region 24. This completes the fabrication of a semiconductor device according to an embodiment of the present invention.

Referring again to FIG. 7, FIG. 7 further illustrates a structural view of a semiconductor device according to an embodiment of the present invention. As shown in FIG. 7, the semiconductor device includes at least a metal gate 46 disposed on the substrate 12, a spacer 22 surrounding the metal gate 46, a source/drain region 24 disposed adjacent to two sides of the spacer 22, a CESL 30 around the spacer 22, an ILD layer 32 around the CESL 30, and another ILD layer 62 disposed on the metal gate 46 and the ILD layer 32.

Viewing from a more detailed perspective, the spacer 22 and the CESL 30 preferably include different heights, in which the top surface of the CESL 30 is lower than the top surface of the spacer 22, the top surface of the CESL 30 is lower than the top surface of the metal gate 46, and the top surface of the spacer 22 is lower than the top surface of the metal gate 46. The ILD layer 62 further includes a bottom portion 66 disposed between the metal gate 46 and the ILD layer 32 and a top portion 68 disposed directly on the metal gate 46 and the ILD layer 32, in which the bottom portion 66 contacts the spacer 22 and the CESL 30 directly and the bottom surface of the bottom portion 66 directly contacting the CESL 30 is lower than the bottom surface of the bottom portion 66 directly contacting the spacer 22.

Typically, part of the spacer, part of the contact etch stop layer (CESL), and even part of the interlayer dielectric (ILD) layer may be removed when gate material layer made of polysilicon is removed during current fabrication of metal gate transistor. This forms recesses 36 extending outward to the top region above the source/drain region so that conductive materials such as work function metal layer and low resistance metal layer may be deposited into these recesses to form laterally extended metal gate, which easily results in short circuit with adjacent contact plugs thereby affecting the performance of the device. To resolve this issue, the present invention first forms a metal gate on a substrate, conducts a plasma treatment process to transform the conductive material extended directly above the spacer and CESL into a dielectric portion 58, performs a cleaning process to completely remove this dielectric portion, and then conducts forms an upper level ILD layer. By utilizing this approach, it would be desirable to prevent contact between excessive low resistance metal layer and work function metal layer from the laterally extended metal gate and adjacent contact plugs thereby ensuring the performance of the device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a metal gate on a substrate;
a spacer adjacent to the metal gate;
a source/drain region adjacent to the spacer; and
a contact etch stop layer (CESL) around the spacer, wherein the spacer and the CESL comprise different heights, a top surface of the CESL is lower than a top surface of the spacer, and a topmost surface of the spacer directly contacting the metal gate and the CESL is lower than a top surface of the metal gate and higher than the top surface of the CESL.

2. The semiconductor device of claim 1, wherein a top surface of the CESL is lower than a top surface of the metal gate.

3. The semiconductor device of claim 1, further comprising:
a first interlayer dielectric (ILD) layer around the CESL; and
a second ILD layer on the metal gate and the first ILD layer.

4. The semiconductor device of claim 3, wherein the second ILD layer comprises:
a bottom portion between the metal gate and the first ILD layer; and
a top portion on the metal gate.

5. The semiconductor device of claim 4, wherein the bottom portion contacts the spacer directly.

6. The semiconductor device of claim 4, wherein the bottom portion contacts the CESL directly.

7. The semiconductor device of claim 4, wherein a bottom surface of the bottom portion contacting the CESL is lower than a bottom surface of the bottom portion contacting the spacer.

8. A semiconductor device, comprising:
a metal gate on a substrate;
a spacer adjacent to the metal gate;
a source/drain region adjacent to the spacer;
a contact etch stop layer (CESL) around the spacer, wherein the spacer and the CESL comprise different heights, a top surface of the CESL is lower than a top surface of the spacer, and the top surface of the spacer directly contacting the metal gate and the CESL is lower than a top surface of the metal gate and higher than the top surface of the CESL;
a first interlayer dielectric (ILD) layer around the CESL; and a second ILD layer on the metal gate and the first ILD layer, wherein the second ILD layer comprises:
a bottom portion between the metal gate and the first ILD layer; and
a top portion on the metal gate, wherein a bottom surface of the bottom portion contacting the CESL is lower than a bottom surface of the bottom portion contacting the spacer.

* * * * *